United States Patent
Furuta

(10) Patent No.: US 10,418,958 B2
(45) Date of Patent: Sep. 17, 2019

(54) RADIO COMMUNICATION DEVICE

(71) Applicant: JVC KENWOOD CORPORATION, Yokohama-shi, Kanagawa (JP)

(72) Inventor: Hiroshi Furuta, Yokohama (JP)

(73) Assignee: JVC KENWOOD CORPORATION, Yokohama-Shi, Kanagawa (JP)

( * ) Notice: Subject to any disclaimer, the term of this patent is extended or adjusted under 35 U.S.C. 154(b) by 0 days.

(21) Appl. No.: 16/162,857

(22) Filed: Oct. 17, 2018

(65) Prior Publication Data
US 2019/0158051 A1     May 23, 2019

(30) Foreign Application Priority Data
Nov. 17, 2017   (JP) .................................. 2017-221692

(51) Int. Cl.
| | | |
|---|---|---|
| *H04B 1/46* | (2006.01) | |
| *H03G 3/34* | (2006.01) | |
| *G10L 25/87* | (2013.01) | |
| *H04L 5/16* | (2006.01) | |
| *G10L 25/78* | (2013.01) | |

(52) U.S. Cl.
CPC .............. *H03G 3/344* (2013.01); *G10L 25/87* (2013.01); *G10L 2025/783* (2013.01); *H04L 5/16* (2013.01)

(58) Field of Classification Search
CPC .......... H04B 1/46; H04B 1/48; H04B 17/318; H04W 4/10; H04L 5/16; G10L 25/87; G19L 25/90; H03G 3/344; H03G 3/345; H03G 3/348; H03G 3/28
See application file for complete search history.

(56) References Cited

U.S. PATENT DOCUMENTS

| | | | | |
|---|---|---|---|---|
| 5,327,461 A * | 7/1994 | Kushige | ................. | H04B 1/46 375/244 |
| 5,867,574 A * | 2/1999 | Eryilmaz | ................. | H04B 1/46 379/388.04 |
| 7,221,661 B2 * | 5/2007 | Matsui | ................. | H04B 1/40 370/324 |
| 2009/0017879 A1* | 1/2009 | Tsfaty | ................. | H04B 1/46 455/574 |
| 2011/0053540 A1* | 3/2011 | Sekimukai | ........ | H04W 52/0216 455/230 |
| 2018/0294835 A1* | 10/2018 | Furuta | ................. | H04B 1/48 |

FOREIGN PATENT DOCUMENTS

JP     H7-321693 A     12/1995

* cited by examiner

*Primary Examiner* — Thanh C Le
(74) *Attorney, Agent, or Firm* — Nath, Goldberg & Meyer; Jerald L. Meyer

(57) ABSTRACT

A voice level comparator compares a level of a voice signal collected by a microphone with a VOX level. A transmission determination unit instructs a transmitter to transmit the voice signal, when the level of the voice signal is equal to or greater than the VOX level, based on a comparison result by the voice level comparator. A timer starts to measure an elapsed time from a point of time when a switch is operated. A VOX level selector seta a first VOX level as the VOX level when the elapsed time measured by the timer exceeds a reference elapsed time, and sets a second VOX level which is smaller than the first VOX level as the VOX level when the elapsed time measured by the timer stays within the reference elapsed time.

6 Claims, 10 Drawing Sheets

RADIO COMMUNICATION DEVICE

CROSS REFERENCE TO RELATED APPLICATION

This application is based upon and claims the benefit of priority under 35 U.S.C. § 119 from Japanese Patent Application No. 2017-221692 filed on Nov. 17, 2017, the entire contents of which are incorporated herein by reference.

BACKGROUND

The present disclosure relates to a radio communication device provided with a Voice-operated Transmit (VOX) function.

In a radio communication device that adopts a half-duplex communication method, the radio communication device is switched to a transmission state by pressing a Push-to-talk (PTT) switch, and the radio communication device is switched to a standby state for reception by releasing the pressing of the PTT switch.

In addition, in order to achieve a hands-free call, the radio communication device may sometimes be provided with a so-called VOX function to switch the radio communication device to the transmission state when a microphone collects a voice of a predetermined level or more (see Japanese Unexamined Patent Application Publication No. 07-321693 (published in 1995)).

SUMMARY

In the radio communication device provided with the VOX function, the microphone must collect such a voice of a predetermined level or more in order to activate the VOX function. Accordingly, a user has needed to talk while being conscious of the level of the voice, at which the VOX function is activated. For example, the user has needed to be conscious of starting a call intentionally at a high volume at the time of wishing to start transmission.

Moreover, it takes a predetermined time for the radio communication device to start transmitting the voice with the VOX function being activated. Accordingly, latency may sometimes occur in which the beginning of the call cannot be transmitted.

Accordingly, a radio communication device is desired to appear, which is capable of naturally making a call without being conscious of the level of the voice at the time of starting the call, such as a cellular phone that adopts a full-duplex communication method, and is capable of minimizing the latency.

A first aspect of one or more embodiments provides a radio communication device including: a voice level comparator configured to compare a level of a voice signal collected by a microphone with a VOX level; a transmission determination unit configured to instruct a transmitter to transmit the voice signal, when the level of the voice signal is equal to or greater than the VOX level, based on a comparison result by the voice level comparator; a switch; a timer configured to start to measure an elapsed time from a point of time when the switch is operated; and a VOX level selector configured to set a first VOX level as the VOX level when the elapsed time measured by the timer exceeds a reference elapsed time, and to set a second VOX level which is smaller than the first VOX level as the VOX level when the elapsed time measured by the timer stays within the reference elapsed time.

A second aspect of one or more embodiments provides a radio communication device including: a voice level comparator configured to compare a level of a voice signal collected by a microphone with a VOX level; a transmission determination unit configured to instruct a transmitter to transmit the voice signal, when the level of the voice signal is equal to or greater than the VOX level, based on a comparison result by the voice level comparator; a squelch processor configured to instruct a mute controller to mute a received signal generated by a receiver, when a noise level of the received signal is equal to or greater than a threshold value; a timer configured to start to measure an elapsed time from a point of time when the squelch processor instructs to mute the received signal; and a VOX level selector configured to set a first VOX level as the VOX level when the elapsed time measured by the timer exceeds a reference elapsed time, and to set a second VOX level which is smaller than the first VOX level as the VOX level when the elapsed time measured by the timer stays within the reference elapsed time.

DETAILED DESCRIPTION

Embodiment 1

Figure 1:
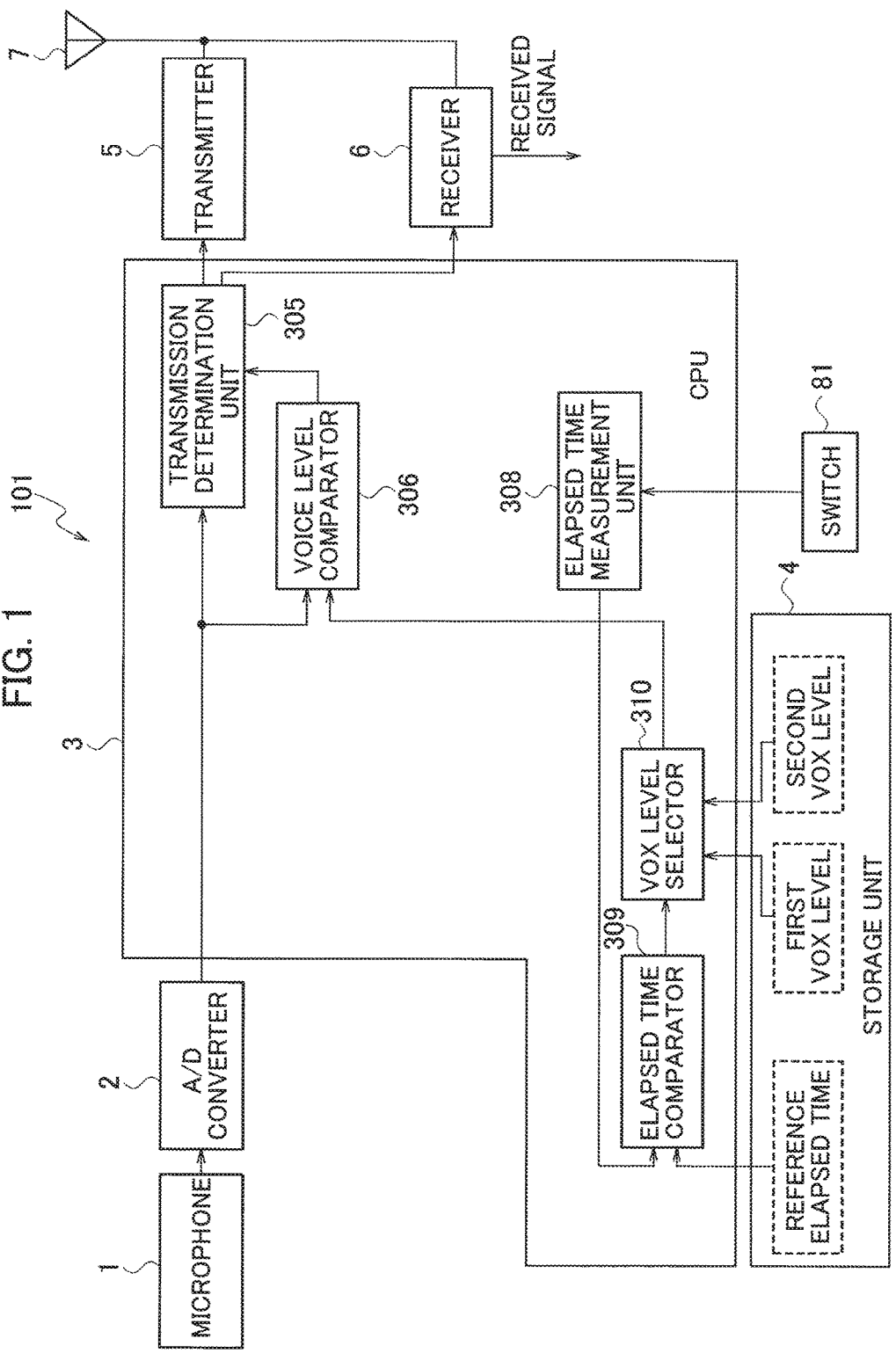
FIG. 1 is a block diagram illustrating a radio communication device according to Embodiment 1.
Figure 2:
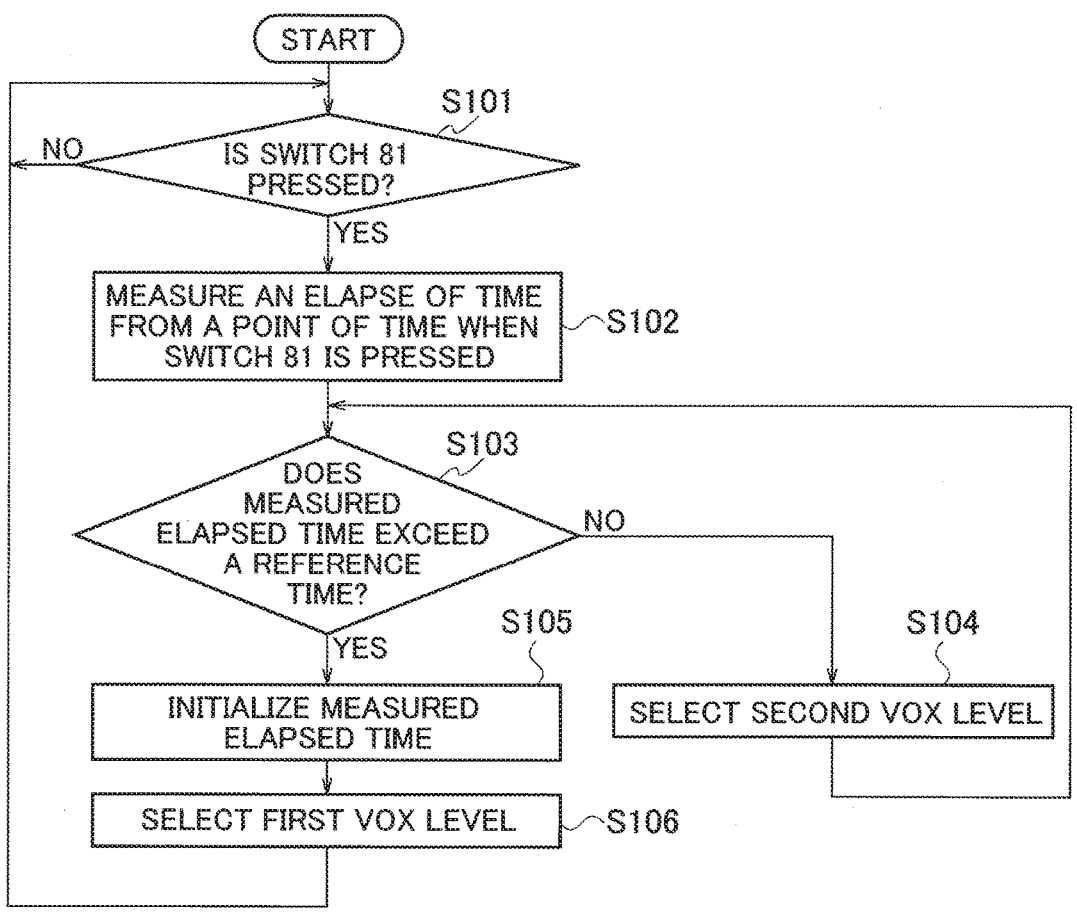
FIG. 2 is a flowchart illustrating operations of the radio communication device according to Embodiment 1.

A description will be given of a radio communication device 101 according to Embodiment 1 with reference to FIGS. 1 and 2. As shown in FIG. 1, the radio communication device 101 includes a microphone 1, an A/D converter 2, a central processing unit (hereinafter, CPU) 3, a storage unit 4, a transmitter 5, a receiver 6, and an antenna 7 for transmission and reception. The storage unit 4 is a nonvolatile memory, and for example, is an Electrically Erasable Programmable Read-only Memory (EEPROM). In FIG. 1, a PTT switch is not shown.

The microphone 1 collects a voice emitted by a user, and supplies an analog voice signal to the A/D converter 2. The A/D converter 2 converts the analog voice signal into a digital voice signal (A/D conversion), and supplies the digital voice signal to the CPU 3.

The CPU 3 includes a transmission determination unit 305, a voice level comparator 306, an elapsed time measurement unit 308, an elapsed time comparator 309, and a VOX level selector 310.

The respective units from the transmission determination unit 305 to the VOX level selector 310 are composed as functions by software executed by the CPU 3; however, the respective units from the transmission determination unit 305 to the VOX level selector 310 may be composed of hardware such as circuits or the like. Choice of the hardware and the software is arbitrary.

When the user presses a switch 81, the elapsed time measurement unit 308 measures an elapsed time from the point of time when the switch 81 is pressed. Information indicating the elapsed time having been measured by the elapsed time measurement unit 308 is supplied to the elapsed time comparator 309. The storage unit 4 stores a reference elapsed time, a first VOX level, and a second VOX level. The elapsed time comparator 309 compares the elapsed time having been measured by the elapsed time measurement unit 308 with the reference elapsed time.

The elapsed time measurement unit 308 that measures the elapsed time from the point of time when the switch 81 is pressed, and the elapsed time comparator 309 that compares the elapsed time having been measured by the elapsed time measurement unit 308 with the reference elapsed time stored in the storage unit 4, compose a timer that starts to measure an elapsed time when the switch 81 is pressed and measures the reference elapsed time.

A comparison result by the elapsed time comparator 309 is supplied to the VOX level selector 310. The VOX level selector 310 selects the first VOX level when the measured elapsed time exceeds the reference elapsed time, and selects the second VOX level when the measured elapsed time stays within the reference elapsed time. Note that it is possible to arbitrarily set the reference elapsed time, the first VOX level and the second VOX level, which are stored in the storage unit 4.

The first VOX level and the second VOX level have a relationship of: first VOX level>second VOX level. That is, if the radio communication device 101 determines whether or not a voice collected by the microphone 1 is at a predetermined level or more with the second VOX level taken as a reference, then the VOX function will be activated at a relatively small volume. If the radio communication device 101 determines whether or not the voice collected by the microphone 1 is at a predetermined level or more with the first VOX level taken as a reference, then the VOX function will be activated at a volume larger than in the case of taking the second VOX level as a reference.

In other words, VOX sensitivity is higher in the case of setting the second VOX level than in the case of setting the first VOX level.

The first VOX level or the second VOX level, which is selected by the VOX level selector 310, is supplied to the voice level comparator 306. The voice level comparator 306 compares a level of the digital voice signal, which is output by the A/D converter 2, with the VOX level (either one of the first VOX level and the second VOX level) supplied from the VOX level selector 310. The voice level comparator 306 supplies a result of the comparison to the transmission determination unit 305.

If the level of the digital voice signal output from the A/D converter 2 is equal to or greater than the VOX level supplied from the VOX level selector 310 based on the result of the comparison, the transmission determination unit 305 supplies the digital voice signal to the transmitter 5, and instructs the transmitter 5 to transmit the digital voice signal. The transmitter 5 encodes and modulates the voice signal, and transmits the encoded and modulated voice signal from the antenna 7. Moreover, the transmission determination unit 305 instructs the receiver 6 to stop an operation of the reception at the time of instructing the transmitter 5 to transmit the digital voice signal.

Note that when the receiver 6 receives voice data from another radio communication device from the antenna 7, the receiver 6 decodes and demodulates the voice data to generate a received signal (voice signal). The configuration to process the received signal is not shown.

The fact that the level of the digital voice signal output from the A/D converter 2 is not equal to or greater than the VOX level supplied from the VOX level selector 310 means that the user does not emit a voice. In this case, the transmission determination unit 305 does not instruct the transmitter 5 to transmit the voice signal.

The second VOX level is selected if the measured elapsed time stays within the reference elapsed time. Therefore, the user does not need to start a call intentionally at a high volume, and can start a call at a normal volume. The user can increase the sensitivity of the VOX by a predetermined time set by the reference elapsed time, by pressing the switch 81 at an arbitrary timing. If the user presses the switch 81 at the timing when the user tries to start a call, the user does not need to talk at an unnaturally high volume, and is able to have a natural conversation with the communication partner.

Note that, when the radio communication device 10 always uses the second VOX level, the VOX function is activated at a relatively low volume, and a malfunction may possibly occur. Hence, it is not preferable to always use the second VOX level. A time of using the second VOX level is limited to the reference elapsed time of the elapsed time from the point of time when the switch 81 is pressed. In this way, the user can have such a natural conversation with the communication partner while preventing an occurrence of the malfunction.

Moreover, herein, an elapsed time is measured from the point of time when the user presses the switch 81, however, the user does not need to keep pressing the switch 81. Therefore, the elapsed time measurement unit 308 may measure an elapsed time from the point of time when the switch 81 is pressed. That is, the elapsed time measurement unit 308 may start measuring an elapsed time by detecting that the switch 81 has been operated by the user.

By using a flowchart shown in FIG. 2, a description will be given of switching processing for the VOX level in the radio communication device 101 according to Embodiment 1. Note that in Embodiment 1 and all subsequent embodiments, it is assumed that the first VOX level is set as the initial value. In FIG. 2, while the radio communication device is under reception, then in step S101, the CPU 3 determines whether or not the switch 81 is pressed. If the switch 81 is not pressed, then the CPU 3 repeats processing of step S101. If the switch 81 is pressed, then in step S102, the CPU 3 starts to measure an elapse of time from a point of time when the switch 81 is pressed.

In step S103, the CPU 3 determines whether or not the elapsed time from the point of time when the switch 81 is pressed exceeds a reference time. If the CPU 3 determines that the elapsed time from the point of time when the switch 81 is pressed does not exceed the reference time (NO), then in step S104, the CPU 3 selects the second VOX level, and returns the processing to step S103.

If the CPU 3 determines in step S103 that the elapsed time from the point of time when the switch 81 is pressed exceeds the reference time (YES), then in step S105, the CPU 3 initializes the measured elapsed time from the point of time when the switch 81 is pressed, and in step S106, selects the first VOX level, and returns the processing to step S101.

In accordance with the radio communication device 101 according to Embodiment 1, by pressing the switch 81 when the user is about to transmit voice, it is not necessary to be conscious of the voice level at which the VOX function is activated, and the call can be started at a normal volume.

Embodiment 2

Figure 3:
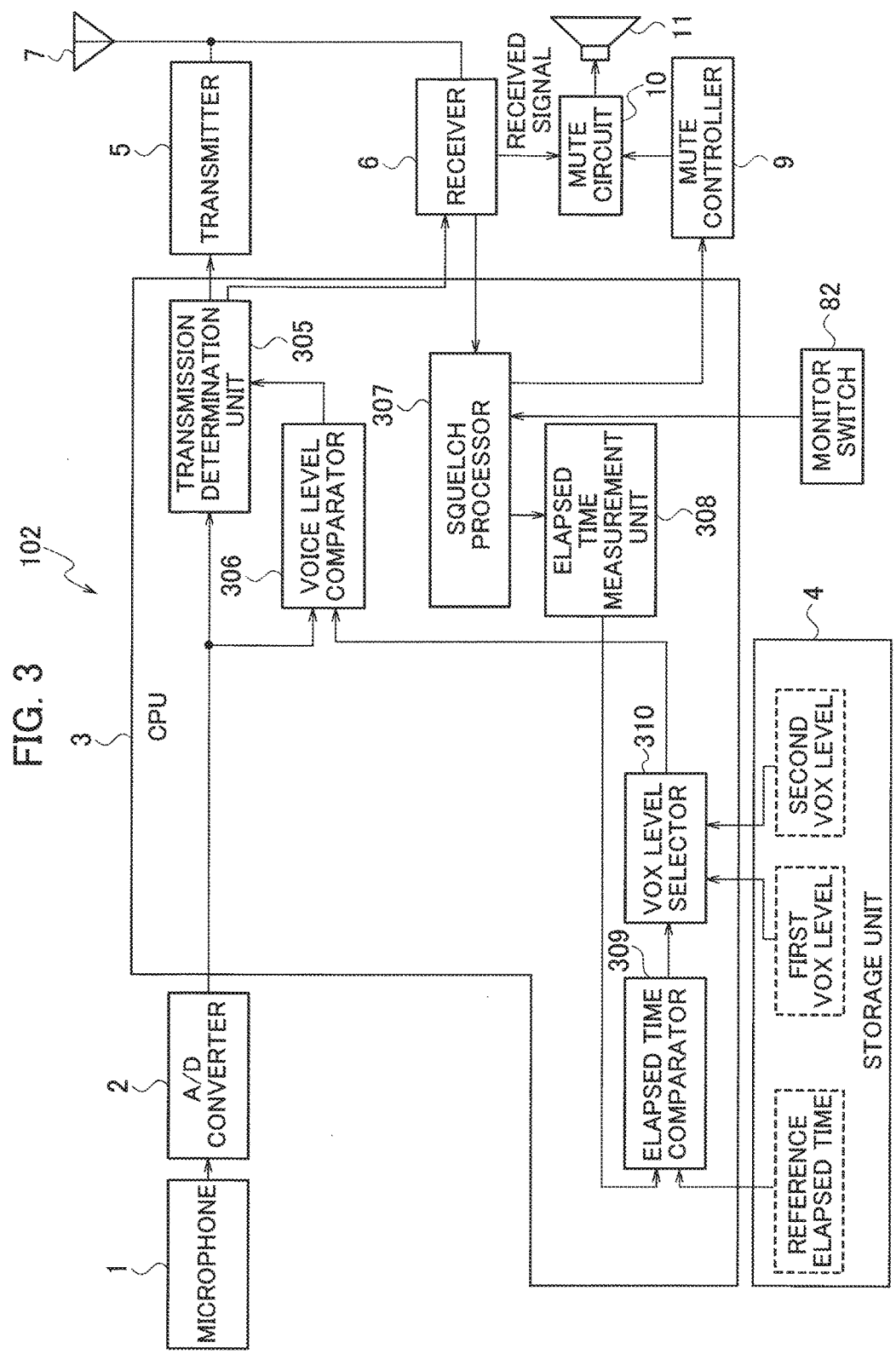
FIG. 3 is a block diagram illustrating a radio communication device according to Embodiment 2.
Figure 4:
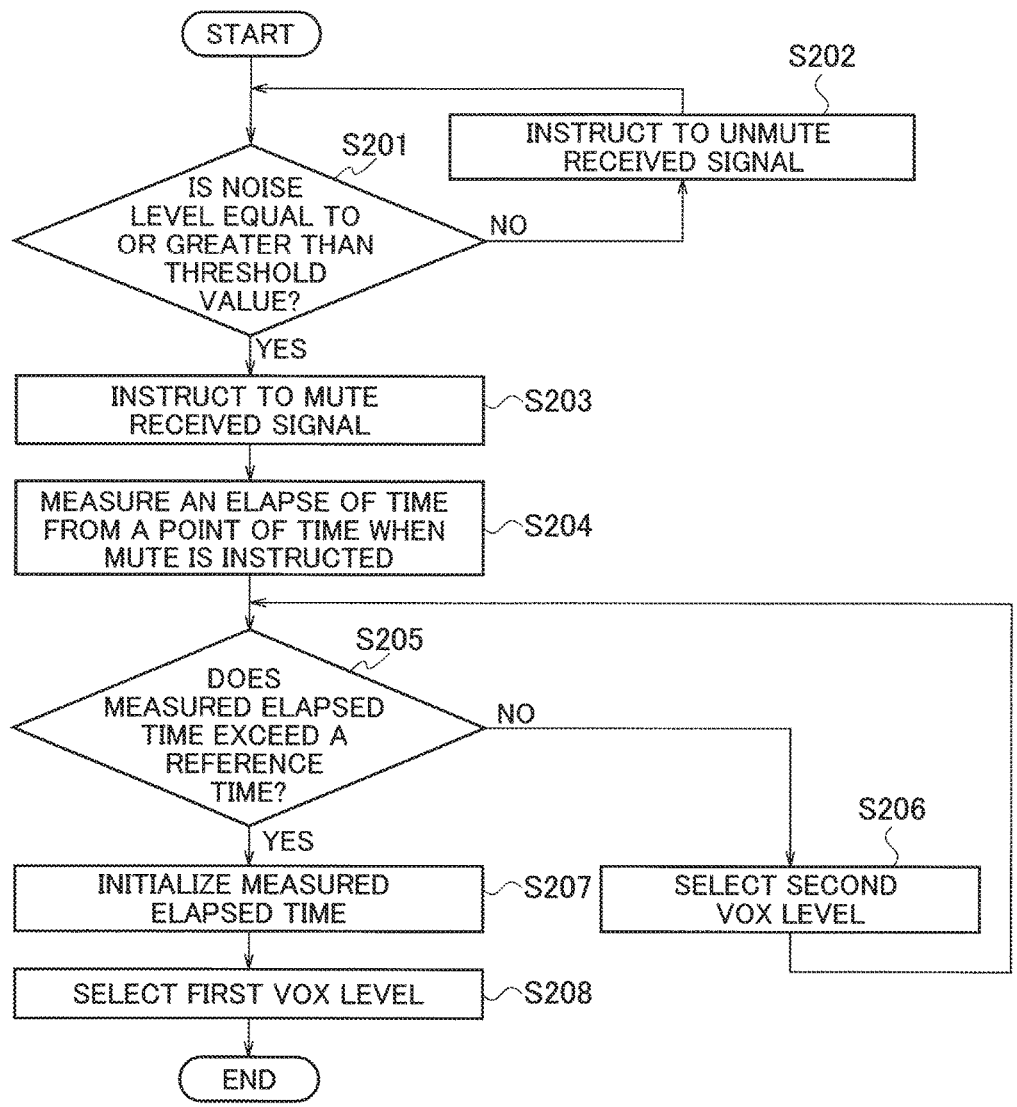
FIG. 4 is a flowchart illustrating basic operations of the radio communication device according to Embodiment 2.
Figure 5:
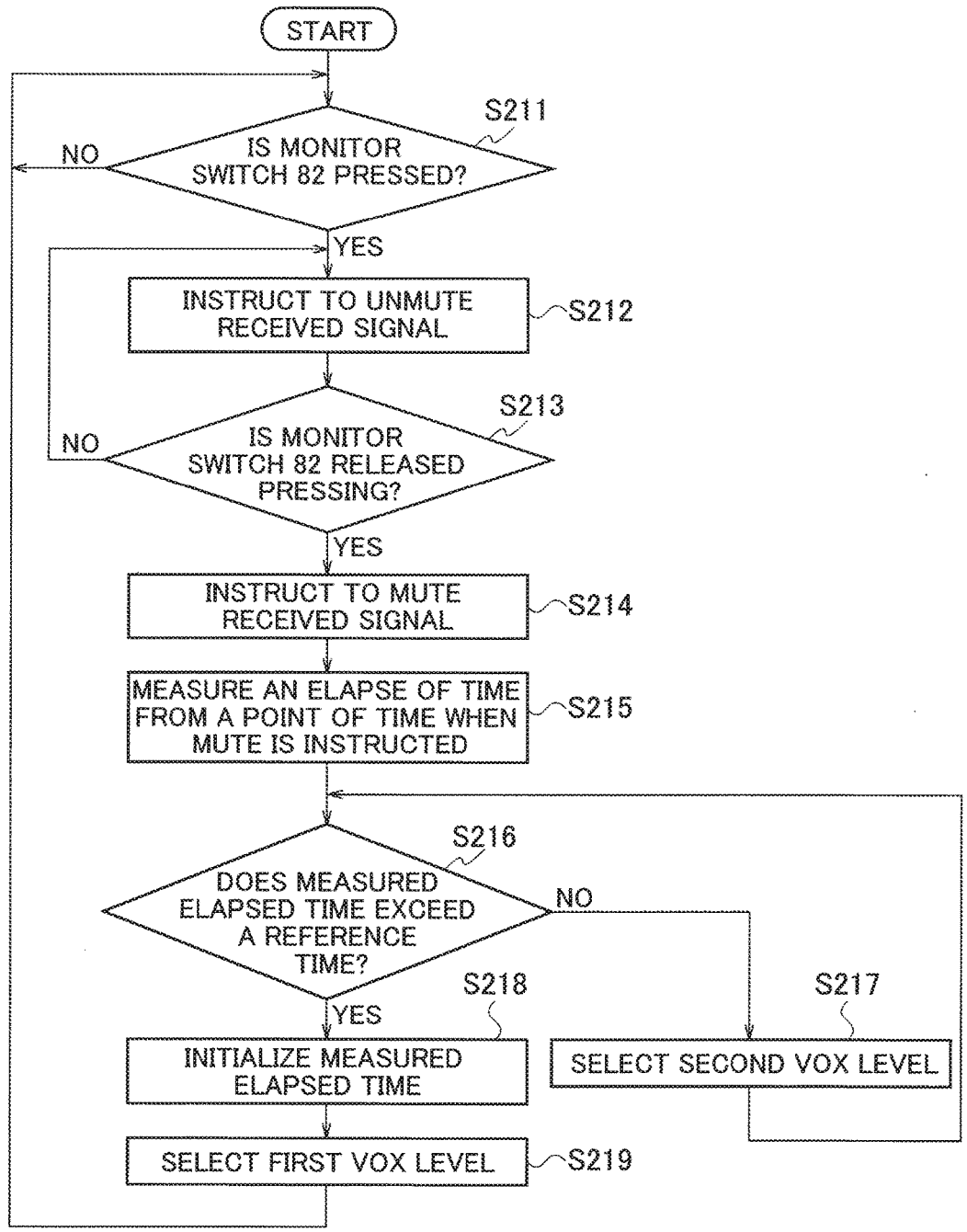
FIG. 5 is a flowchart illustrating operations when a monitor switch is pressed which is provided in the radio communication device according to Embodiment 2.

A description will be given of a radio communication device 102 according to Embodiment 2 with reference to FIGS. 3-5. In the radio communication device 102 according to Embodiment 2, which is shown in FIG. 3, the same reference numerals are assigned to the same portions as those of the radio communication device 101 according to Embodiment 1, and a description thereof is omitted.

The CPU 3 includes a transmission determination unit 305, a voice level comparator 306, a squelch processor 307, an elapsed time measurement unit 308, an elapsed time comparator 309, and a VOX level selector 310. The squelch processor 307 compares the noise level of the signal outside the band of the voice in the received signal generated by the receiver 6 with a predetermined threshold value. If the noise level is equal to or greater than the threshold value, the squelch processor 307 instructs a mute controller 9 to mute the received signal. The mute controller 9 controls a mute circuit 10 to so as to mute the received signal.

In this way, the squelch processor 307 prevents unpleasant noise from being output from the speaker 11. The operation of muting the noise by the squelch processor 307 is called as "squelch closing".

If the noise level is less than the threshold value, the squelch processor 307 instructs a mute controller 9 to unmute the received signal. The mute controller 9 controls the mute circuit 10 to so as to unmute and output the received signal from the speaker 11. The operation of outputting the received signal is called as "squelch opening".

The fact that the squelch processor 307 instructs the mute controller 9 to mute the received signal can be regarded as the reception by the receiver 6 has been completed and has switched to the standby state. Therefore, the squelch processor 307 supplies timing information to the elapsed time measuring unit 308, indicating the timing at which the mute of the received signal is instructed to the mute controller 9.

As a basic operation of the radio communication device 102, the elapsed time measuring unit 308 measures the elapsed time from the point of time when it receives the timing information (that is, from the point of time when mute of the received signal is instructed). The information indicating the elapsed time measured by the elapsed time measuring unit 308 is supplied to the elapsed time comparator 309. The elapsed time comparator 309 compares the elapsed time measured by the elapsed time measuring unit 308 with the reference elapsed time.

The VOX level selector 310 selects the first VOX level when the measured elapsed time exceeds the reference elapsed time, and selects the second VOX level when the measured elapsed time stays within the reference elapsed time.

If the measured elapsed time stays within the reference elapsed time, the second VOX level is selected. Therefore, the user does not need to start a call intentionally at a high volume, and can start a call at a normal volume. The user does not need to talk at an unnaturally high volume when starting a call soon after the reception from a communication partner is ended, and is able to have a natural conversation with the communication partner.

The fact that the elapsed time exceeds the reference elapsed time indicates a state in which the conversation with the communication partner is temporarily ended. The first VOX level is selected at this time. Accordingly, the user speaks at a high volume intentionally when intending to resume the call, thereby activating the VOX function to make it possible to resume the call.

In addition, the radio communication device 102 according to Embodiment 2 is configured as follows, so as not to need to talk intentionally at a high volume when the user intends to resume the call.

The radio communication device 102 includes a monitor switch 82 for intentionally outputting noise from the speaker 11 when the squelch is closed. When the user presses the monitor switch 82, the squelch processor 307 is instructed to unmute the received signal. The squelch processor 307 instructs the mute controller 9 to unmute the received signal only for the period during which the monitor switch 82 is pressed, and opens the squelch.

In the radio communication device 102, in order to switch the VOX level, the user releases the monitor switch 82 after pressing it. If the user releases the monitor switch 82 after pressing it, the squelch processor 307 temporarily instructs the mute controller 9 to unmute the received signal, and immediately instructs muting of the received signal. Since press and release of the monitor switch 82 is a trigger for instructing the mute control controller 9 to unmute the received signal, the user needs to immediately release the monitor switch 82 after pressing it.

Then, as similarly to the basic operation described above, the squelch processor 307 supplies timing information to the elapsed time measurement unit 308, indicating the timing at which the squelch processor 307 instructed the mute controller 9 to mute the reception signal.

Therefore, the elapsed time measurement unit 308 measures the elapsed time from the point of time when it receives the timing information (that is, from the point of time when the monitor switch 82 is released from being pressed). The information indicating the elapsed time measured by the elapsed time measurement unit 308 is supplied to the elapsed time comparator 309. The elapsed time comparator 309 compares the elapsed time having been measured by the elapsed time measurement unit 308 with the reference elapsed time.

The VOX level selector 310 selects the first VOX level when the measured elapsed time exceeds the reference elapsed time, and selects the second VOX level when the measured elapsed time stays within the reference elapsed time. The second VOX level is selected if the measured elapsed time stays within the reference elapsed time, therefore, the user does not need to start a call intentionally at a high volume, and can resume the call at a normal volume.

By using a flowchart shown in FIG. 4, a description will be given of switching processing for the VOX level, as a basic operation, in the radio communication device 102 according to Embodiment 2. In FIG. 4, in step S201, the CPU 3 determines whether or not the noise level is equal to or greater than the threshold value. If the noise level is not equal to or greater than the threshold value (NO), the CPU 3 instructs the mute controller 9 to unmute the received signal in step S202, and returns the processing to step S201.

If the noise level is equal to or greater than the threshold value (YES) in step S201, the CPU 3 instructs the mute controller 9 to mute the received signal in step S203. In step S204, the CPU 3 measures an elapse of time from a point of time when mute is instructed.

In step S205, the CPU 3 determines whether or not the elapsed time from the point of time when mute is instructed exceeds a reference time. If the CPU 3 determines that the elapsed time from the point of time when mute is instructed does not exceed the reference time (NO), then in step S206, the CPU 3 selects the second VOX level, and returns the processing to step S205.

If the CPU 3 determines in step S205 that the elapsed time from the point of time when mute is instructed exceeds the reference time (YES), then in step S207, the CPU 3 initializes the measured elapsed time from the point of time when mute is instructed, and in step S208, selects the first VOX level, and ends the processing.

By using a flowchart shown in FIG. 5, a description will be given of switching processing for the VOX level in the radio communication device 102 according to Embodiment 2, when the monitor switch 82 is pressed. In FIG. 5, in step S211, the CPU 3 determines whether or not the monitor switch 82 is pressed. If the monitor switch 82 is not pressed (NO), the CPU 3 repeats processing of step S211.

If the monitor switch 82 is pressed (YES) in step S211, the CPU 3 instructs the mute controller 9 to unmute the received signal in step S212. In step S213, the CPU 3 determines whether or not the monitor switch 82 is released from being pressed. If the monitor switch 82 is not released from being pressed (NO), the CPU 3 repeats processing of steps S212 and S213.

If the monitor switch 82 is released from being pressed (YES) in step S213, the CPU 3 instructs the mute controller 9 to mute the received signal in step S214, and the CPU 3 starts measuring an elapse of time from a point of time when mute is instructed in step S215.

In step S216, the CPU 3 determines whether or not the elapsed time from the point of time when mute is instructed exceeds a reference time. If the CPU 3 determines that the elapsed time from the point of time when mute is instructed does not exceed the reference time (NO), then in step S217, the CPU 3 selects the second VOX level, and returns the processing to step S216.

If the CPU 3 determines in step S216 that the elapsed time from the point of time when mute is instructed exceeds the reference time (YES), then in step S218, the CPU 3 initializes the measured elapsed time from the point of time when mute is instructed, selects the first VOX level in step S219, and returns the processing to step S211.

The radio communication device 102 according to Embodiment 2 regards that the reception by the receiver 6 has been completed and has switched to the standby state after the following time. The time is when the squelch processor 307 instructs the mute controller 9 to mute the received signal. Then, the radio communication device 102 according to Embodiment 2 selects the second VOX level if the elapsed time from the point of time when mute is instructed stays within the reference elapsed time. Therefore, in accordance with the radio communication device 102 according to Embodiment 2, the user does need to start a call intentionally at a high volume, and can start a call at a normal volume.

In addition, in accordance with the radio communication device 102 according to Embodiment 2, by pressing the monitor switch 82 when the user is about to transmit voice at an arbitrary timing, it is not necessary to be conscious of the voice level at which the VOX function is activated, and the call can be started at a normal volume.

Embodiment 3

A description will be given of a radio communication device 103 according to Embodiment 3 with reference to FIGS. 6 and 7. In the radio communication device 103 according to Embodiment 3, which is shown in FIG. 6, the same reference numerals are assigned to the same portions as those of the radio communication device 101 according to Embodiment 1, and a description thereof is omitted.

Figure 6:
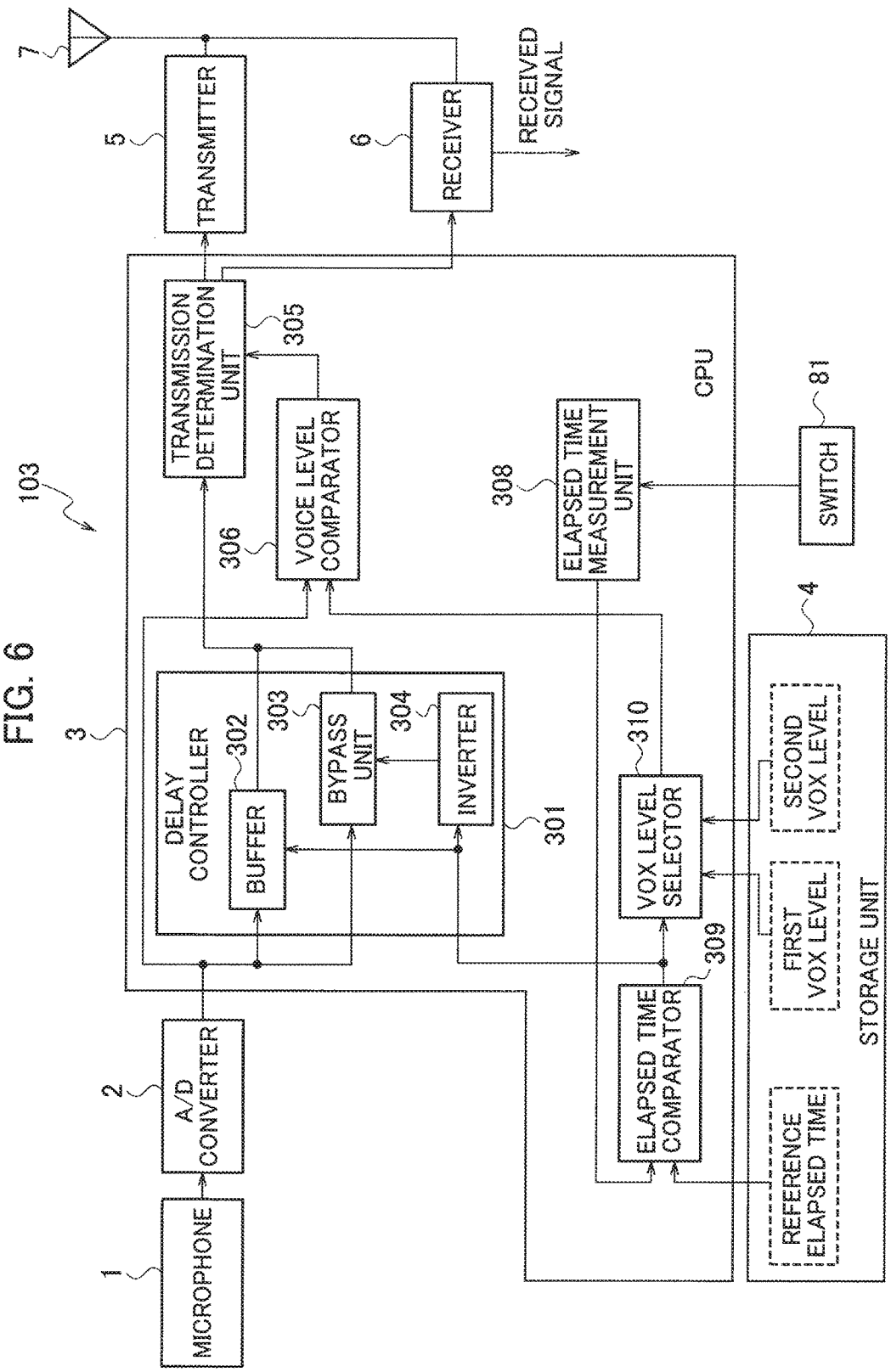
FIG. 6 is a block diagram illustrating a radio communication device according to Embodiment 3.
Figure 7:
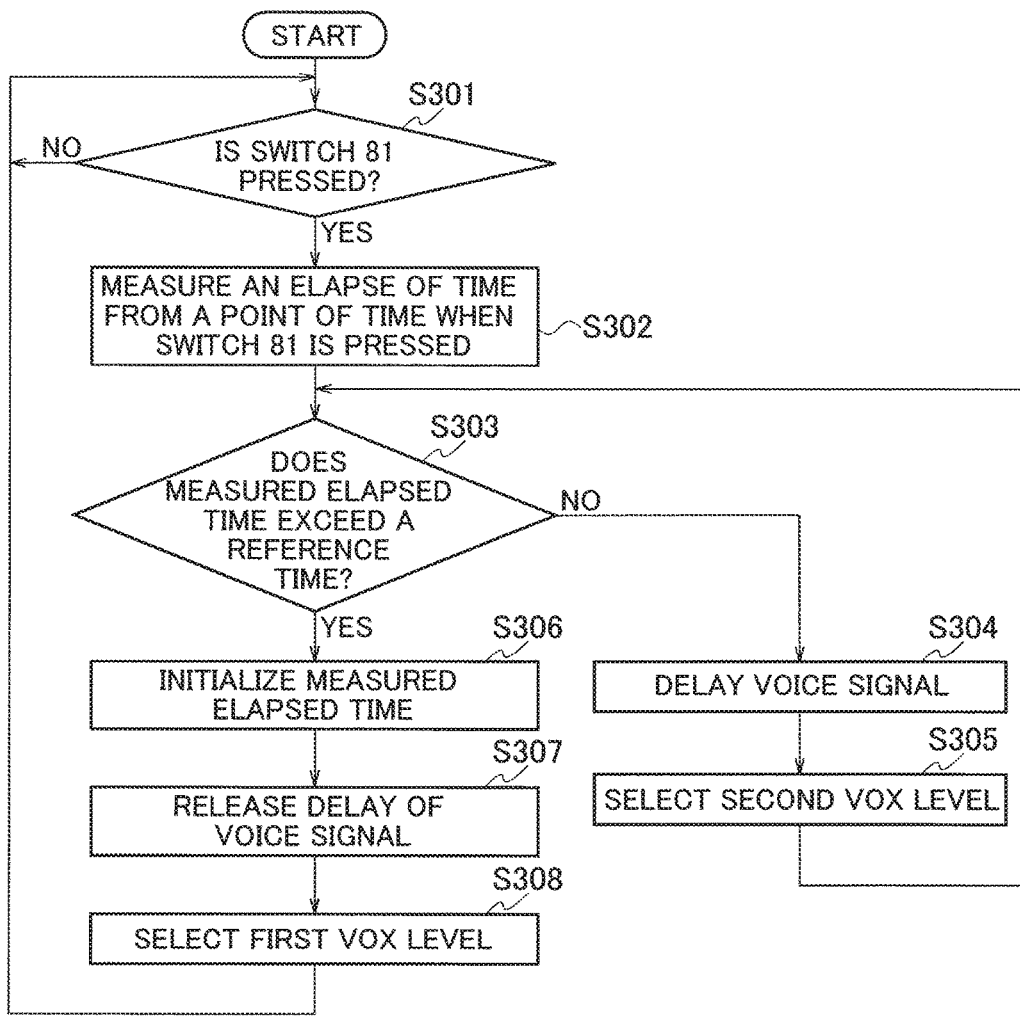
FIG. 7 is a flowchart illustrating operations of the radio communication device according to Embodiment 3.

As shown in FIG. 6, the radio communication device 103 has a configuration in which a delay controller 301 is added to the radio communication device 101. The delay controller 301 includes a buffer 302, a bypass unit 303, and an inverter 304.

The buffer 302 records a voice signal in a First-In, First-Out (FIFO) method, and reproduces the voice signal. Specifically, the buffer 302 records the voice signal for a predetermined time, starts to reproduce a portion which is recorded earlier at a point of time when the recording reaches a set recording time, erases the reproduced portion, and continues the recording in a free space, thereby delaying the digital voice signal for a predetermined time.

The buffer 302 delays the digital voice signal input from the A/D converter 2, and supplies the delayed digital voice signal to the transmission determination unit 305. If the elapsed time from the point of time when the switch 81 is pressed stays within the reference elapsed time, based on the comparison result sent from the elapsed time comparator 309, then the buffer 302 performs delay processing carried out by the recording and the reproduction.

If the elapsed time from the point of time when the switch 81 is pressed exceeds the reference elapsed time, based on the comparison result sent from the elapsed time comparator 309, then the buffer 302 does not perform the delay processing carried out by the recording and the reproduction. Note that a length of time while the recording is possible may be arbitrarily settable by the user using the radio communication device 103.

The bypass unit 303 supplies the digital voice signal, which is input from the A/D converter 2 to the transmission determination unit 305 without delaying the digital voice signal concerned. If the elapsed time from the point of time when the switch 81 is pressed stays within the reference elapsed time, based on the comparison result sent from the elapsed time comparator 309 input via the inverter 304, then the bypass unit 303 does not pass the digital voice signal therethrough. If the elapsed time from the point of time when the switch 81 is pressed exceeds the reference elapsed time, based on the comparison result sent from the elapsed time comparator 309, then the bypass unit 303 passes the digital voice signal therethrough.

In order to exclusively switch the buffer 302 and the bypass unit 303, the inverter 304 inverts a logic of the comparison result sent from the elapsed time comparator 309, and supplies such an inverted logic signal to the bypass unit 303.

In the radio communication device 103 according to Embodiment 3, if the elapsed time from the point of time when the switch 81 is pressed stays within the reference elapsed time, based on the comparison result sent from the elapsed time comparator 309, then the buffer 302 operates, and the inverter 304 stops the operation of the bypass unit 303. Moreover, if the elapsed time from the point of time when the switch 81 is pressed exceeds the reference elapsed time, based on the comparison result sent from the elapsed time comparator 309, then the buffer 302 stops operating, and the bypass unit 303 operates. In place of the bypass unit 303, a switch that turns on/off according to an instruction from the inverter 304 may be provided.

With the above configuration, the delay controller 301 performs the following operations. If the elapsed time from the point of time when the switch 81 is pressed stays within the reference elapsed time, then the delay controller 301 delays the digital voice signal sent from the A/D converter 2 by a predetermined time, and supplies the delayed digital voice signal to the transmission determination unit 305. Meanwhile, if the elapsed time from the point of time when the switch 81 is pressed exceeds the reference elapsed time, then the delay controller 301 supplies the digital voice signal to the transmission determination unit 305 without delaying the digital voice signal concerned.

In accordance with the radio communication device 103 according to Embodiment 3, if the elapsed time from the point of time when the switch 81 is pressed stays within the reference elapsed time, a delayed digital voice signal is input to the transmission determination unit 305, from the point of time when the level of the digital voice signal is detected to be equal to or greater than the second VOX level, and the delayed digital voice signal is supplied to the transmitter 5 for transmission.

In addition, in accordance with the radio communication device 103 according to Embodiment 3, if the elapsed time from the point of time when the switch 81 is pressed exceeds the reference elapsed time, a non-delayed digital voice signal is input to the transmission determination unit 305, from the point of time when the level of the digital voice signal is detected to be equal to or greater than the first VOX level, and the non-delayed digital voice signal is supplied to the transmitter 5 for transmission.

In the conventional transmission of the voice by the VOX function, during a period from when the voice is input to the microphone 1 until when the level of the voice reaches the VOX level, and further, during a period from when the instruction to start the transmission is issued until the transmitter 5 operates, the voice input to the microphone 1 is not transmitted, and latency occurs.

On the contrary, the radio communication device 103 according to Embodiment 3 records a voice signal before the level of the voice input to the microphone 1 reaches the VOX level for a time sufficiently longer than the time until the transmitter 5 operates since a voice is input to the microphone 1. Accordingly, in the transmission of the voice by the VOX function by Embodiment 3, the voice signal started to be reproduced after the transmitter 5 operates is transmitted, latency at the beginning of the call can be substantially eliminated.

Moreover, in the case of a radio communication device such as a portable radio communication device which operates with batteries, the batteries are consumed to a large extent if the radio communication device is always kept in a recording state during the reception. Therefore, in accordance with the radio communication device 103 according to Embodiment 3, the recording operation is performed only when a call is started soon after the switch 81 is pressed, whereby a natural conversation with the communication partner is enabled without much consumption of batteries, and without latency. In addition, in accordance with the radio communication device 103 according to Embodiment 3, when the conversation with the communication partner is temporarily ended, the recording is stopped, thus making it possible to reduce power consumption.

By using a flowchart shown in FIG. 7, a description will be given of switching processing for the VOX level and delay processing for the voice signal in the radio communication device 103 according to Embodiment 3. Note that, since steps S301-S303 are the same as steps S101-S103, a description thereof will be omitted.

If the CPU 3 determines in step S303 that the elapsed time from the point of time when the switch 81 is pressed does not exceed the reference elapsed time (NO), then in step S304, the CPU 3 delays the voice signal from the microphone 1, selects the second VOX level in step S305, and returns the processing to step S303.

If the CPU 3 determines in step S303 that the elapsed time from the point of time when the switch 81 is pressed exceeds the reference elapsed time (YES), then in step S306, the CPU 3 initializes the elapsed time, and releases the delay of the voice signal output from the microphone 1 in step S307. In step S308, the CPU 3 selects the first VOX level, and returns the processing to step S301.

In the radio communication device 101 according to Embodiment 1, even when the second VOX level is selected in step S104, or even when the first VOX level is selected in step S106, if the level of the digital voice signal is equal to or greater than the respective VOX level, then the CPU 3 issues an instruction to start the transmission of the digital voice signal from the point of time when the digital voice signal exceeds the respective VOX level.

In the radio communication device 103 according to Embodiment 3, if the first VOX level is selected in step S308, then the CPU 3 instructs the transmitter 5 to start the transmission of the digital voice signal from the point of time when the digital voice signal exceeds the first VOX level. On the other hand, if the second VOX level is selected in step S305, then the CPU 3 instructs the transmitter 5 to start the transmission of the digital voice signal delayed by the buffer 302 of the delay controller 301.

The radio communication device 103 according to Embodiment 3 has an advantageous effect that latency at the beginning of the call can be substantially eliminated, in addition to the advantageous effect by the radio communication device 101 according to Embodiment 1.

Embodiment 4

Figure 8:
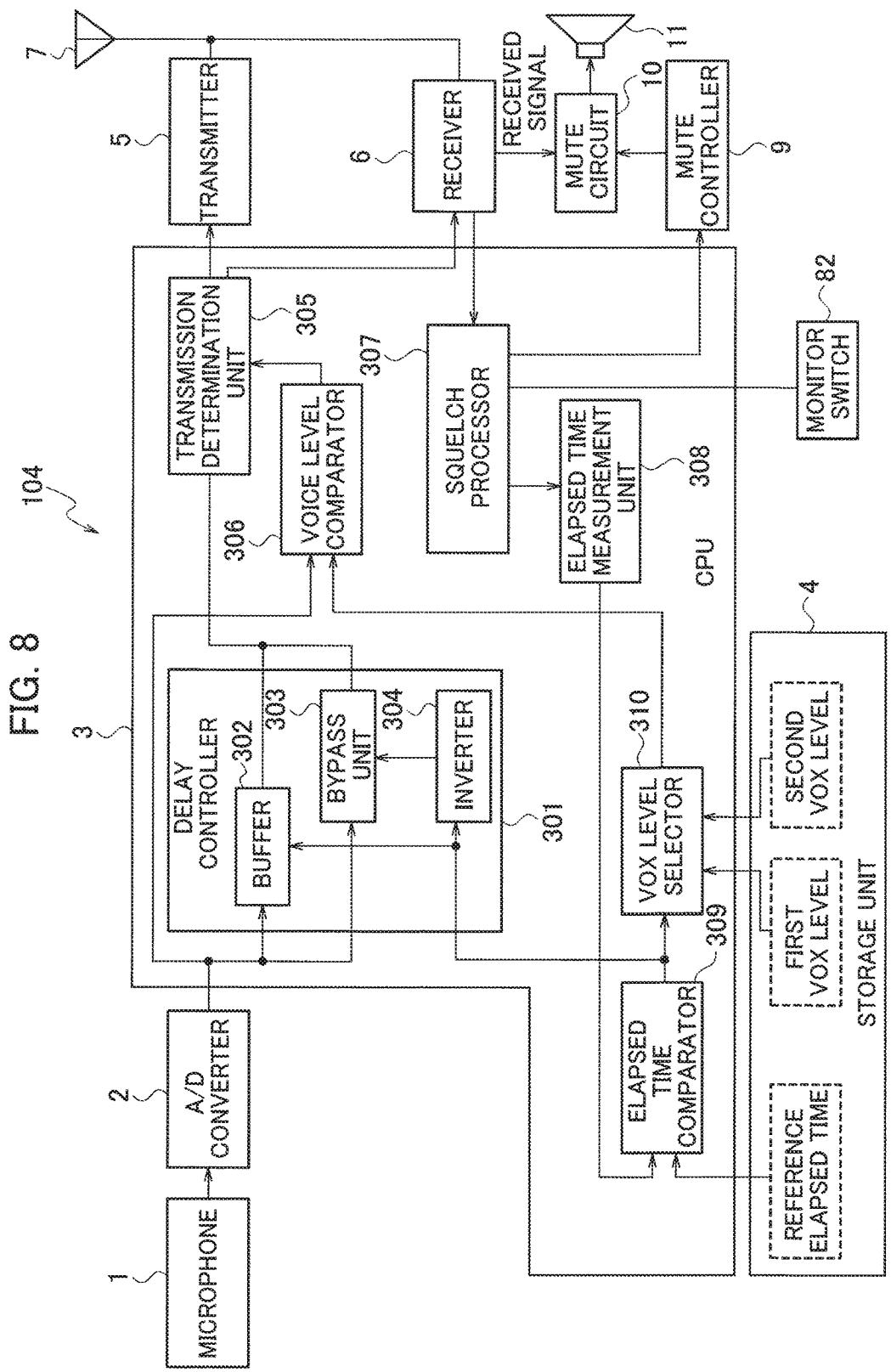
FIG. 8 is a block diagram illustrating a radio communication device according to Embodiment 4.
Figure 9:
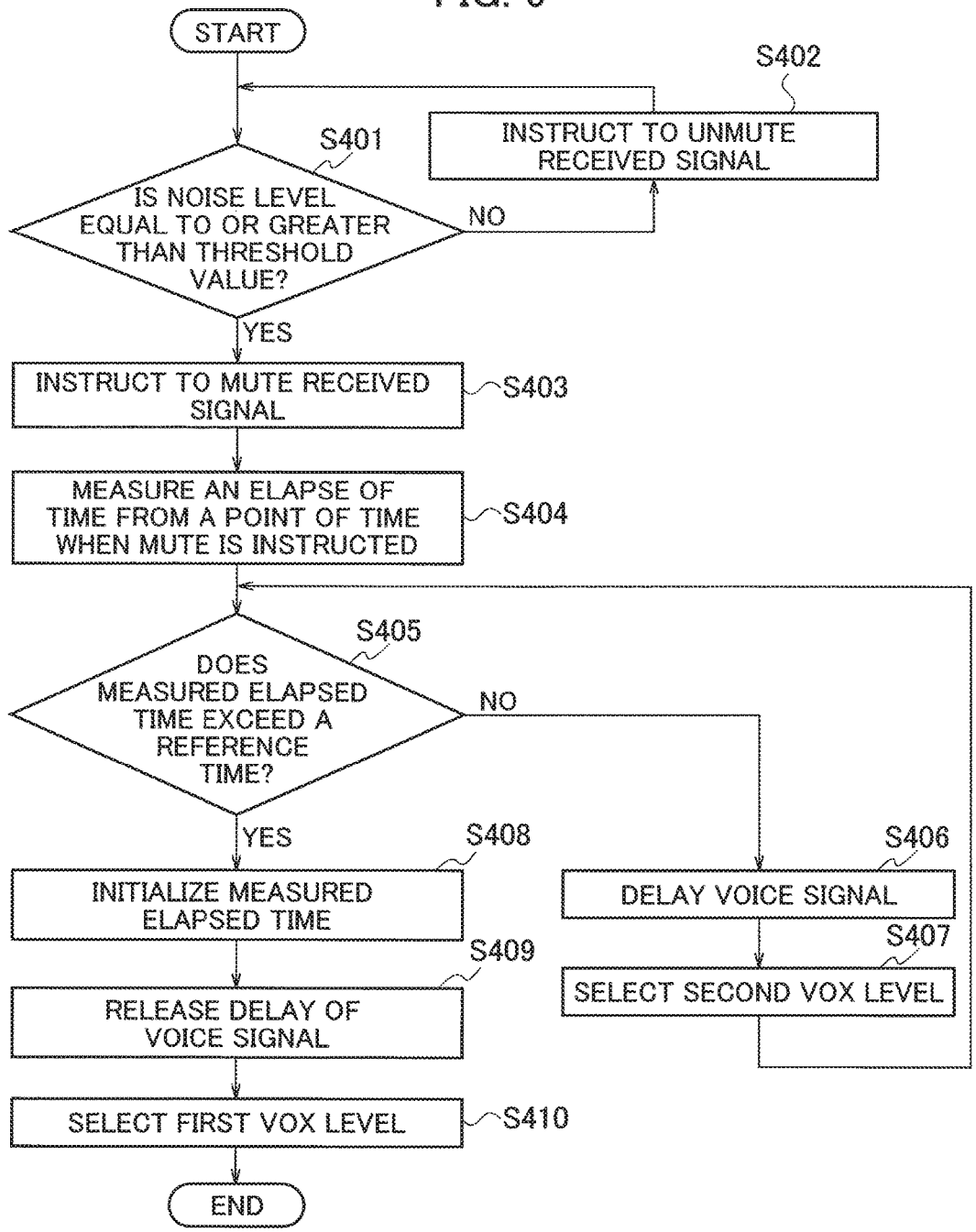
FIG. 9 is a flowchart illustrating basic operations of the radio communication device according to Embodiment 4.
Figure 10:
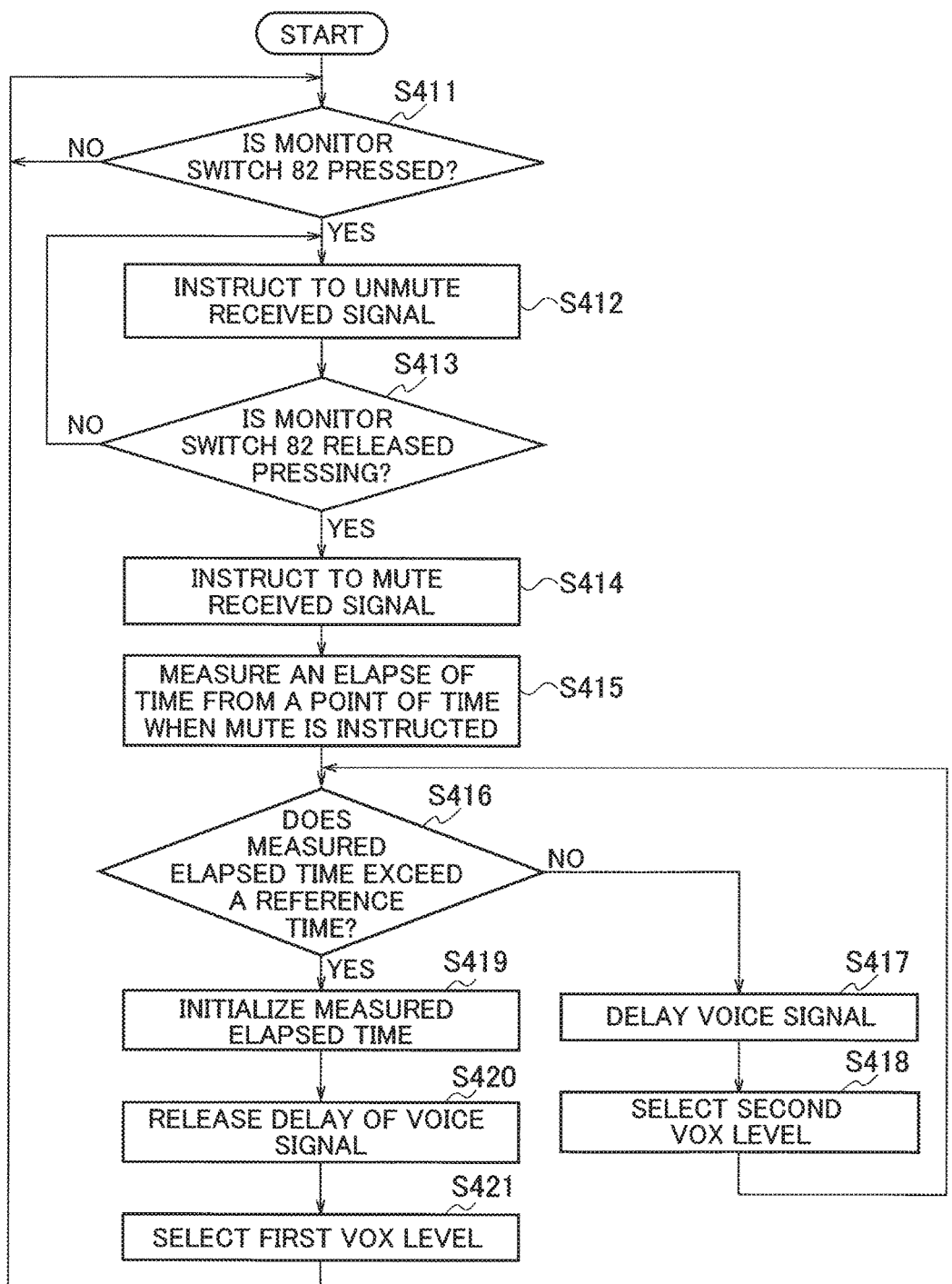
FIG. 10 is a flowchart illustrating operations when a monitor switch is pressed which is provided in the radio communication device according to Embodiment 4.

A description will be given of a radio communication device 104 according to Embodiment 4 with reference to FIGS. 8-10. In the radio communication device 104 according to Embodiment 4, which is shown in FIG. 8, the same reference numerals are assigned to the same portions as those of the radio communication device 102 according to Embodiment 2 or the radio communication device 103 according to Embodiment 3, and a description thereof is omitted. As shown in FIG. 8, the radio communication device 104 has a configuration in which a delay controller 301 is added to the radio communication device 102.

In the radio communication device 104 according to Embodiment 4, if the elapsed time from the point of time when mute is instructed stays within the reference elapsed time, based on the comparison result by the elapsed time comparator 309, then the buffer 302 operates, and the inverter 304 stops the operation of the bypass unit 303. Moreover, if the elapsed time from the point of time when mute is instructed exceeds the reference elapsed time, based on the comparison result by the elapsed time comparator 309, then the buffer 302 stops operating, and the bypass unit 303 operates.

With the above configuration, the delay controller 301 performs the following operations. If the elapsed time from the point of time when mute is instructed stays within the reference elapsed time, then the delay controller 301 delays the digital voice signal sent from the A/D converter 2 by a predetermined time, and supplies the delayed digital voice signal to the transmission determination unit 305. Meanwhile, if the elapsed time from the point of time when mute is instructed exceeds the reference elapsed time, then the delay controller 301 supplies the digital voice signal to the transmission determination unit 305 without delaying the digital voice signal concerned.

Accordingly, in accordance with the radio communication device 104 according to Embodiment 4, if the elapsed time from the point of time when mute is instructed stays within the reference elapsed time, a delayed digital voice signal is input to the transmission determination unit 305, from the point of time when the level of the digital voice signal is detected to be equal to or greater than the second VOX level, and the delayed digital voice signal is supplied to the transmitter 5 for transmission.

In addition, in accordance with the radio communication device 104 according to Embodiment 4, if the elapsed time from the point of time when mute is instructed exceeds the reference elapsed time, a non-delayed digital voice signal is input to the transmission determination unit 305, from the point of time when the level of the digital voice signal is detected to be equal to or greater than the first VOX level, and the non-delayed digital voice signal is supplied to the transmitter 5 for transmission.

By using a flowchart shown in FIG. 9 a description will be given of switching processing for the VOX level and delay processing for the voice signal, as a basic operation, in the radio communication device 104 according to Embodiment 4. Note that, since steps S401-S405 are the same as steps S201-S205, a description thereof will be omitted.

If the CPU 3 determines that the elapsed time from the point of time when mute is instructed does not exceed the reference time (NO), then the CPU 3 delays the voice signal from the microphone 1 in step S406, selects the second VOX level in step S407, and returns the processing to step S405.

If the CPU 3 determines in step S405 that the elapsed time from the point of time when mute is instructed exceeds the reference time (YES), then in step S408, the CPU 3 initializes the measured elapsed time, and releases the delay of the voice signal from the microphone 1 in step S409. In step S410, the CPU 3 selects the first VOX level, and ends the processing.

By using a flowchart shown in FIG. 10, a description will be given of switching processing for the VOX level and delay processing for the voice signal in the radio communication device 104 according to Embodiment 4, when the monitor switch 82 is pressed. Steps S411-S416 are the same as steps S211-S216, a description thereof will be omitted.

If the CPU 3 determines in step S416 that the elapsed time from the point of time when mute is instructed does not exceed the reference time (NO), then in step S417, the CPU 3 delays the voice signal from the microphone 1, selects the second VOX level in step S418, and returns the processing to step S416.

If the CPU 3 determines in step S416 that the elapsed time from the point of time when mute is instructed exceeds the reference time (YES), then in step S419, the CPU 3 initializes the measured elapsed time, and releases the delay of the voice signal from the microphone 1 in step S420. In steps S421, the CPU 3 selects the first VOX level, and returns the processing to step S411.

The radio communication device 104 according to Embodiment 4 has an advantageous effect that latency at the beginning of the call can be substantially eliminated, in addition to the advantageous effect by the radio communication device 102 according to Embodiment 2.

The present invention is not limited to the configuration of the above-described Embodiments 1, 2, 3, and 4, and various modifications can be made without departing from the scope of the invention.

What is claimed is:

1. A radio communication device comprising:
   a voice level comparator configured to compare a level of a voice signal collected by a microphone with a VOX level;
   a transmission determination unit configured to instruct a transmitter to transmit the voice signal, when the level of the voice signal is equal to or greater than the VOX level, based on a comparison result by the voice level comparator;
   a switch;
   a timer configured to start to measure an elapsed time from a point of time when the switch is operated; and
   a VOX level selector configured to set a first VOX level as the VOX level when the elapsed time measured by the timer exceeds a reference elapsed time, and to set a second VOX level which is smaller than the first VOX level as the VOX level when the elapsed time measured by the timer stays within the reference elapsed time.

2. A radio communication device comprising:
   a voice level comparator configured to compare a level of a voice signal collected by a microphone with a VOX level;
   a transmission determination unit configured to instruct a transmitter to transmit the voice signal, when the level of the voice signal is equal to or greater than the VOX level, based on a comparison result by the voice level comparator;
   a squelch processor configured to instruct a mute controller to mute a received signal generated by a receiver, when a noise level of the received signal is equal to or greater than a threshold value;
   a timer configured to start to measure an elapsed time from a point of time when the squelch processor instructs to mute the received signal; and
   a VOX level selector configured to set a first VOX level as the VOX level when the elapsed time measured by the timer exceeds a reference elapsed time, and to set a second VOX level which is smaller than the first VOX level as the VOX level when the elapsed time measured by the timer stays within the reference elapsed time.

3. The radio communication device according to claim 2, further comprising a monitor switch to cause the mute controller to instruct the squelch processor to unmute the received signal, only for a period during which the monitor switch is pressed,
   wherein the timer measures an elapsed time from a point of time when the squelch processor instructs the mute controller to mute the received signal, by releasing a pressing of the monitor switch.

4. The radio communication device according to claim 3, further comprising a delay controller configured to delay the voice signal collected by the microphone for a predetermined time,
   wherein the transmission determination unit instructs the transmitter to transmit a delayed voice signal by the delay controller, when the elapsed time measured by the timer stays within the reference elapsed time, and when the level of the voice signal collected by the microphone exceeds the second VOX level.

5. The radio communication device according to claim 4, wherein the delay controller comprises:
a buffer configured to delay and output the voice signal collected by the microphone by recording and reproducing the voice signal for a predetermined time; and
a bypass unit configured to output the voice signal collected by the microphone without delaying the voice signal,
and wherein the transmission determination unit instructs the transmitter to transmit the voice signal output from the buffer, when the elapsed time measured by the timer stays within the reference elapsed time, and to transmit the voice signal output from the bypass unit, when the elapsed time measured by the timer exceeds the reference elapsed time.

6. The radio communication device according to claim 5, wherein the delay controller stops a function of the buffer when the elapsed time measured by the timer exceeds the reference elapsed time.

\* \* \* \* \*